(12) United States Patent
Hedberg et al.

(10) Patent No.: US 6,731,168 B2
(45) Date of Patent: May 4, 2004

(54) POWER AMPLIFIER LINEARIZER THAT COMPENSATES FOR LONG-TIME-CONSTANT MEMORY EFFECTS AND METHOD THEREFOR

(75) Inventors: David J. Hedberg, Menlo Park, CA (US); James A. Sills, Scottsdale, AZ (US); Eric M. Brombaugh, Mesa, AZ (US)

(73) Assignee: Intersil Americas, Inc., Scottsdale, AZ (US)

( * ) Notice: Subject to any disclaimer, the term of this patent is extended or adjusted under 35 U.S.C. 154(b) by 191 days.

(21) Appl. No.: 10/071,736

(22) Filed: Feb. 6, 2002

(65) Prior Publication Data

US 2003/0146787 A1 Aug. 7, 2003

(51) Int. Cl.$^7$ ................................................ H03F 1/30
(52) U.S. Cl. ........................................ 330/149; 330/289
(58) Field of Search ................................ 330/149, 289, 330/2

(56) References Cited

U.S. PATENT DOCUMENTS

| | | | | |
|---|---|---|---|---|
| 5,049,832 A | | 9/1991 | Cavers | 330/149 |
| 5,778,029 A | | 7/1998 | Kaufmann | 375/296 |
| 5,862,460 A | * | 1/1999 | Rich | 455/116 |
| 5,867,065 A | | 2/1999 | Leyendecker | 330/149 |
| 5,959,500 A | | 9/1999 | Garrido | 330/151 |
| 6,011,434 A | * | 1/2000 | Sakai | 330/151 |
| 6,141,390 A | | 10/2000 | Cova | 375/297 |
| 6,255,908 B1 | * | 7/2001 | Ghannouchi et al. | 330/149 |
| 6,373,902 B1 | * | 4/2002 | Park et al. | 375/296 |

OTHER PUBLICATIONS

Author: Joel, Vuolevi, Timo Rahkonene, Jani Manninen Title: Measurement Technique for Characterizing Memory Effects in RF Power Amplifiers Pages: Four (4) Pages.
Author: Joel, Vuolevi, Timo Rahkonene, Jani Manninen Title: Measurement Technique for Characterizing Memory Effects in RF Power Amplifiers Pages: Fifteen (15).
Author: R. Blum, M.C. Jeruchim Title: Modeling Nonlinear Amplifiers for Communication Simulation Date: 1989 Pages Five (5).
Author: Michael S. Heutmaker, Eleanor Wu and John R. Welch Title: Envelope Distortion Models with Memory Improve the Prediction of Spectral Re–growth for some RF Amplifiers Pages: Six (6).
Author: Joel Vuolevi Title: Analysis, Measurement and Cancellation of the Bandwidth and Amplitude Dependence of Intermodulation Distortion in RF Power Amplifiers Pages: 160.
Author: Wolfgang Bösch and Giuliano Gatti Title: Measurement and Simulation of Memory Effects in Predistortion Linearizers Date: 1989 Pages: Six (6).
Author: James K. Cavers and Maria W. Liao Title: Adaptive Compensation for Imbalance and Offset Losses in Direct Conversion Transceivers Pages: Eight (8).
Title: Advanced Design Systm Power Amplifier Linearization Course Date: 2001 Pages: 190.

\* cited by examiner

*Primary Examiner*—Patricia Nguyen
(74) *Attorney, Agent, or Firm*—Lowell W. Gresham; Jordan M. Meschkow; Meshkow & Gresham PLC

(57) ABSTRACT

A power amplifier linearizer (12) includes an on-chip portion (60) and an external controller (22). The on-chip portion (60) implements two predistortion circuits (86, 88) desirably configured as look-up tables. One predistortion circuit (88) is programmed by the external controller (22) to apply a hotter linearizing translation function (54) and the other predistortion circuit (86) is programmed by the external controller (22) to apply a colder linearizing translation function (56). One or more temperature signals (24, 38) are correlated with the temperatures experienced by a power amplifier (34) and drive a power amplifier thermal modeler (50) implemented in the controller (22). As a result of running the thermal modeler (50), the controller (22) generates an interpolation signal (26) that indicates how far to interpolate between the hotter and colder translation functions (54, 56).

29 Claims, 3 Drawing Sheets

US 6,731,168 B2

POWER AMPLIFIER LINEARIZER THAT COMPENSATES FOR LONG-TIME-CONSTANT MEMORY EFFECTS AND METHOD THEREFOR

RELATED INVENTION

The present invention claims benefit under 35 U.S.C. §119(e) to: "Power Amplifier Memory-Effect Compensation With Interpolated Predistortion," Provisional U.S. Patent Application Serial No. 60/333,880, filed Nov. 26, 2001, which is incorporated by reference herein.

TECHNICAL FIELD OF THE INVENTION

The present invention relates generally to the field of digital communications. More specifically, the present invention relates to transmitter power amplifier linearization through the use of predistortion.

BACKGROUND OF THE INVENTION

Power amplifiers are one of the most expensive and most power-consuming devices in communication systems. Digital predistortion is a technique that both reduces power amplifier cost while improving efficiency. Predistortion refers to distortion intentionally applied to a communication signal prior to amplification in a power amplifier. The distortion is configured to be the inverse of unwanted distortion introduced by the power amplifier, so that the resulting amplified communication signal comes out as nearly linear as possible.

With predistortion the power linearity is improved and extended so that the power amplifier can be operated at higher power. This means that a lower-power, lower-cost linearized power amplifier can be used in place of a higher-power, higher-cost power amplifier. Furthermore, the linearized power amplifier operates more efficiently, and a lower-power amplifier operating more efficiently consumes substantially less power than an inefficient higher-power amplifier. Moreover, these benefits are even more pronounced for multicarrier and CDMA applications where peak-to-average ratios tend to be large.

In general, gain and phase transfer characteristics of a typical power amplifier change as a function of the magnitude of the communication signal being amplified. In particular, gain tends to droop and phase shift tends to increase as communication signal magnitude approaches a saturation point for the power amplifier. Accordingly, a typical linearizer will amplify the communication signal by an amount which is a function of magnitude to compensate for gain droop, and apply an opposing-polarity phase shift as a function of magnitude to compensate for the power amplifier-induced phase shift.

However, a need exists to apply linearization so that a communication signal amplified in a power amplifier is as precisely linear as possible to achieve the greatest benefits. A variety of power amplifier memory effects make the generation of highly effective predistortion signals difficult. In general, memory effects refer to tendencies of power amplifiers to act differently in one set of circumstances than in another. For example, the gain and phase transfer characteristics of a power amplifier may vary as a function of frequency, instantaneous power variation, amplifier bias conditions, temperature, and component aging.

Frequency and bias-related memory effects tend to demonstrate short time constants, typically on the order of a few unit intervals. A unit interval refers to the baseband signal sampling period or approximately the inverse of the bandwidth or data rate of the modulated RF signal. These short-time-constant memory effects may be addressed by power amplifier circuit design and also by linearizer design. One effective technique for addressing the problem of short-time-constant memory effects in a linearizer applies different translation functions to different unit intervals in much the same manner that a digital filter applies different coefficients to different samples. Each translation function requires its own look-up table, with each look-up table having in-phase and quadrature components. Unfortunately, a large number of look-up tables is required.

Memory effects due to component aging and other factors can demonstrate extremely long time constants, often greater than hundreds of millions of unit intervals. These extremely-long-time-constant memory effects may be addressed by employing a trainer that monitors the power amplifier output and, knowing the linearizer translation functions being applied, calculates a more accurate transfer function for the power amplifier and/or a more accurate linearizer translation function. The calculations performed by the trainer tend to be computationally intense, but can be performed through appropriate software programs running on a computer quickly enough to track an extremely-long-time-constant memory effect. Typically, look-up tables that implement translation functions are updated as needed to track the extremely-long-time-constant memory effect.

A problem exists in tracking memory effects that exhibit time constants between the short and the extremely long time constants. These memory effects are referred to as long time constants herein. A thermal memory effect is an example of a long-time-constant memory effect. Unlike the short-time-constant memory effects that tend to be related to the signal bandwidth or modulation data rate, the long-time-constant memory effects, such as the thermal memory effect, tend to be physically related. The transfer characteristics of a power amplifier change as a function of the temperature of the power amplifier, including the semiconductor structures of the components that form the power amplifier. This temperature is a function of the ambient temperature and of self-heating due to the power level at which the amplified communication signal is generated. Temperature changes tend to cause changes in power amplifier performance more quickly than the extremely-long-time-constant memory effects, but less quickly than short-time-constant memory effects. In a typical power amplifier, time constants in the range of tens of microseconds may be observed for power amplifier transfer characteristics when shifting between low and high input power levels due to self-heating in the power amplifier.

The short-time-constant memory effect solutions of applying multiple linearizing translation functions to different unit intervals of a communication signal are unsuitable for addressing long-time-constant memory effects. The undesirably large number of look-up tables used to apply correction over just a few unit intervals would be impractical when extended over the hundreds or thousands of unit intervals that characterize a long-time-constant memory effect. Moreover, the impracticability of this technique becomes exacerbated when applied to high speed data because of the higher power and processing complexities of high-throughput applications.

Likewise, the extremely-long-time-constant memory effect solutions of updating look-up tables as needed to track power amplifier performance changes are unsuitable for addressing long-time-constant memory effects. The training function is too computationally complex to be completed sufficiently fast to track thermal effects in a practical manner, and the data transfer requirements for updating entire look-up tables in sufficient time to track thermal effects are too great.

SUMMARY OF THE INVENTION

It is an advantage of the present invention that an improved power amplifier linearizer that compensates for thermal memory effects and method therefor are provided.

Another advantage of the present invention is that a power amplifier linearizer and method track power amplifier transfer function changes having long time constants without requiring an undesirably large number of look-up tables.

Another advantage of the present invention is that a power amplifier linearizer and method are suitable for use in connection with high speed data, where unit intervals tend to be less than a few microseconds.

Another advantage of the present invention is that a power amplifier linearizer and method are provided that use internal predistortion translation functions augmented by an external thermal modeler.

These and other advantages are realized in one form by an improved power amplifier linearizer which compensates for thermal memory effects of a power amplifier and includes first and second predistortion circuits, a temperature indicator, a combiner and a scaling circuit. The first predistortion circuit generates a first predistortion signal in response to a data-conveying signal, where the first predistortion signal is associated with a first temperature for the power amplifier. The second predistortion circuit generates a second predistortion signal in response to the data-conveying signal, where the second predistortion signal is associated with a second temperature for the power amplifier. The temperature indicator generates a temperature signal which correlates with temperatures experienced by the power amplifier. The combiner couples to the first and second predistortion circuits and the temperature indicator. The combiner produces a temperature compensated predistortion signal in response to the first predistortion signal, the second predistortion signal, and the temperature signal. The scaling circuit couples to the combiner and is adapted to receive the data-conveying signal. The scaling circuit scales the data-conveying signal in response to the temperature-compensated predistortion signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
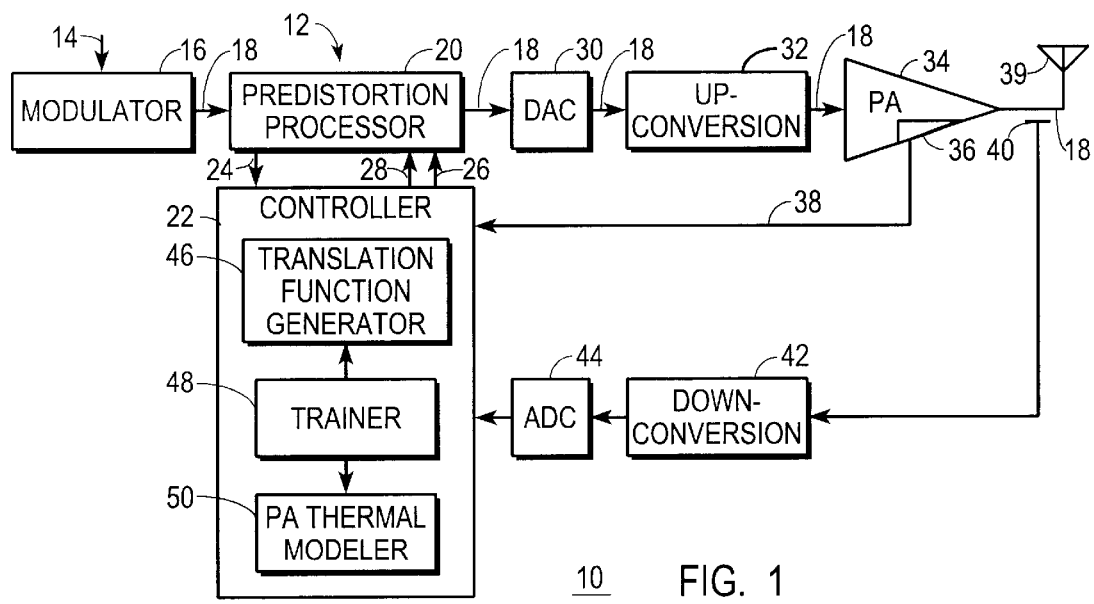
FIG. 1 shows a block diagram of a transmitter that uses a power amplifier linearizer configured in accordance with the teaching of the present invention.

FIG. 1 shows a block diagram of a transmitter 10 that uses a power amplifier linearizer 12 configured in accordance with the teaching of the present invention. Data 14 to be communicated are applied at an input to a modulator 16. Data 14 may be applied at a high-speed data rate in which unit intervals are less than a few microseconds in duration, e.g. greater than 0.5 Mbps. Modulator 16 modulates data 14 using any of a wide variety of modulation formats. In a typical application, modulator 16 applies a form of both amplitude and phase modulation, which will benefit from linear amplitude and linear phase processing downstream. Linearizer 12 will aid in maintaining linear processing. Modulator 16 generates a data-conveying signal 18 that is applied to an input of a predistortion processor 20.

Predistortion processor 20 operates in conjunction with a controller 22 to form linearizer 12. In particular, predistortion processor 20 provides a temperature signal 24 derived from the envelope of data-conveying signal 18 to controller 22 and receives an interpolation signal 26 and programming data 28 from controller 22. While the figures illustrate separate lines for temperature signal 24, interpolation signal 26, and programming data 28, those skilled in the art will appreciate that a common data bus may be used for communicating these and other signals.

Predistortion processor 20 passes data-conveying signal 18, now intentionally distorted as a result of operations performed within predistortion processor 20, to a digital-to-analog converter (DAC) 30. DAC 30 converts data-conveying signal 18 into an analog form, which then passes to an up-conversion section 32. Up-conversion section 32 includes the mixers, filters, combining circuits, local oscillators, and the like conventionally included in transmitters, and processes data-conveying signal 18 into an RF form. The RF form of data-conveying signal 18 then passes to power amplifier (PA) 34.

Power amplifier 34 may be of a conventional design, preferably implementing a power-efficient architecture, such as the well-known class AB architecture. In a typical application, power amplifier 34 is a lower-power, less expensive power amplifier that is operated with less back-off than would be required without the use of linearizer 12.

In one embodiment, power amplifier 34 includes a temperature indicator 36 that generates one or more temperature signals 38. Temperature signals 38 are applied to controller 22. Temperature indicator 36 may monitor a bias current in a final stage of power amplifier 34, may monitor a temperature-indicating semiconductor junction in proximity to the final-stage semiconductor junctions which serve as power amplifier 34, and the like. Thus, temperature indicator 36 is configured so that temperature signals 38 are generated in response to power amplifier 34 and correlate with temperatures experienced by power amplifier 34.

The amplified, RF form of data-conveying signal 18 passes from an output of power amplifier 34 to an antenna 39, where it is broadcast from transmitter 10. At a coupler 40 located downstream of the power amplifier 34 output, a small portion of the energy of the amplified, RF form of data-conveying signal 18 is routed to a down-conversion section 42. Down-conversion section 42 includes the filters, mixers, and other circuits conventionally found in down-conversion sections of RF communication equipment. Down-conversion section 42 generates a baseband, or near baseband, analog version of the amplified data-conveying signal 18. This baseband version of signal 18 is routed to an analog-to-digital converter (ADC) 44 for conversion into a digital form. The digital form passes to controller 22 from ADC 44.

Controller 22 may be implemented using a programmable computer, such as a microprocessor, a personal computer or the equivalent. In a preferred embodiment, controller 22 is programmed through appropriate computer software to implement a translation function generator 46, a trainer 48, and a power amplifier (PA) thermal modeler 50.

Translation function generator 46 and trainer 48 are optional sections of controller 22 that may be configured in a conventional manner when included. When translation function generator 46 and trainer 48 are omitted, down-conversion section 42 and ADC 44 may also be omitted. In a typical application, trainer 48 monitors the amplified version of data-conveying signal 18 provided through down-conversion section 42 to determine the transfer functions that characterize the performance of power amplifier 34. Those skilled in the art will appreciate that this may be a computationally complex task requiring a relatively long time to complete. Preferably, trainer 48 does not simply determine a single transfer function, but determines a family of transfer functions, with each transfer function being associated with a different temperature for power amplifier. The different temperatures are characterized by different values exhibited by temperature signals 24 and/or 38.

Trainer 48 operates in conjunction with translation function generator 46. Translation function generator 46 desirably determines the inverse of the power amplifier 34 transfer functions discerned by trainer 48. Preferably, a family of inverse power amplifier transfer functions, hereinafter referred to as translation functions, are generated in translation function generator 46 for each family of power amplifier transfer functions discerned by trainer 48. Those skilled in the art will appreciate that this may be a computationally complex task requiring a relatively long time to complete. Each translation function describes the translation needed for a given operating condition to distort data-conveying signal 18 prior to amplification in power amplifier 34 so that after amplification data-conveying signal 18 is as nearly linear as practical.

Figure 2:
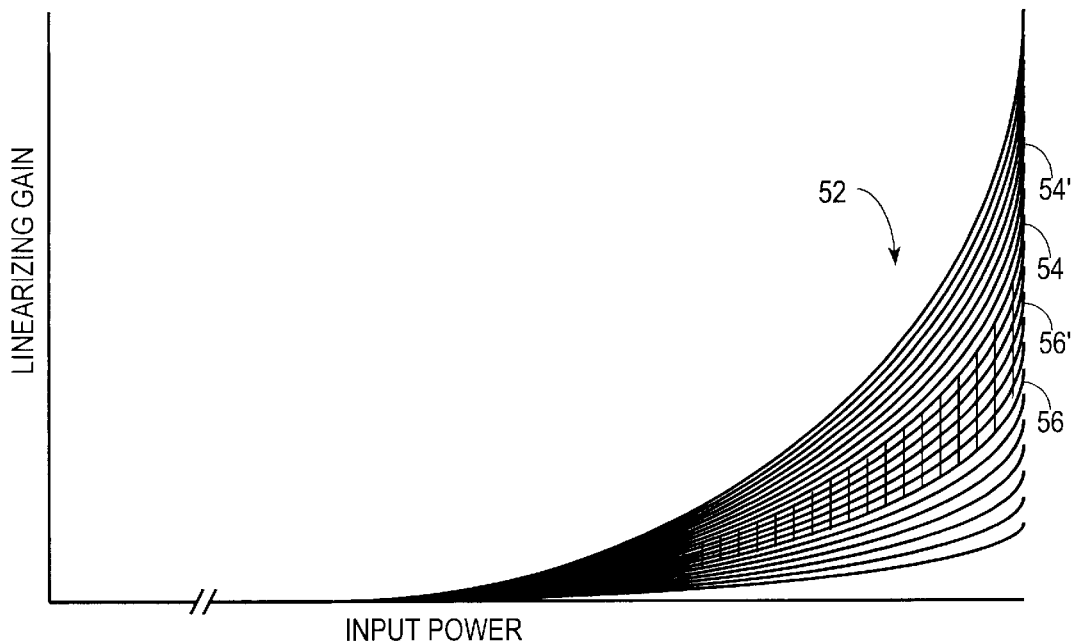
FIG. 2 shows a graph depicting an exemplary family of translation functions applied by the power amplifier linearizer.

FIG. 2 shows a graph depicting an exemplary family of translation functions 52 optionally generated by translation function generator 46 and applied by power amplifier linearizer 12. The graph of FIG. 2 depicts only input power versus linearizing gain for the sake of clarity. Higher temperature translation functions 54 are depicted in association with higher linearizing gain, while lower temperature translation functions 56 are depicted in association with lower linearizing gain.

Referring to FIGS. 1 and 2, at low input power levels, each translation function 52 indicates that linearizer 12 need apply little or no additional gain to compensate for gain droop in power amplifier 34, regardless of temperature. However, as input power increases, linearizer 12 should apply increasing gain to compensate for gain droop in power amplifier 34. Moreover, as temperature increases, the increase in gain becomes more pronounced.

Those skilled in the art will appreciate that the graph of FIG. 2 depicts only gain for the sake of clarity, and that complex signals are characterized by both gain and phase. Thus, a complete characterization of translation functions 52 defines both gain and phase, expressed as complex numbers. Moreover, nothing requires that the input version of data-conveying signal 18 be described strictly in terms of power. Input voltage and log power may also be used to characterize data-conveying signal 18. Further, those skilled in the art will appreciate that the precise shapes of translation functions 52 need not resemble those depicted in FIG. 2 for any specific power amplifier 34, that different power amplifiers 34 may have correspondingly different translation functions 52, and that translation functions 52 for any given power amplifier 34 may change over time as a result of extremely long-time-constant memory effects.

When translation function generator 46 and trainer 48 are omitted, translation functions 52 may be programmed into controller 22 during manufacture and not changed during the operation of transmitter 10. In one such embodiment, translation functions 52 may be individually determined for each transmitter 10 during the manufacturing process so that each transmitter 10 gets a unique set of translation functions 52. In another such embodiment, manufacturing processes for power amplifiers 34, up-conversion section 32, and DAC 30 are sufficiently reliable so that different transmitters 10 exhibit roughly identical performance. Consequently, a single set of translation functions 52 may adequately serve all transmitters 10 manufactured using those manufacturing processes.

Referring to FIG. 1, power amplifier (PA) thermal modeler 50 models the thermal performance of power amplifier 34. In the typical application, thermal modeler 50 is implemented as a filter that combines and filters temperature signals 24 and/or 38. In many applications, a simple filter having a time constant that matches power amplifier thermal behavior will be sufficient, but improved results can be achieved by modeling the thermal performance of power amplifier 34 as precisely as practical. In one embodiment, an analog filter may be employed for PA thermal modeler 50. The goal of thermal modeler 50 is to effectively identify the single translation function 52 that governs current operating conditions for power amplifier 34. PA thermal modeler 50 need not be computationally complex. Consequently, "current" operating conditions may be repetitively calculated on a time scale that accurately tracks the self-heating of power amplifier 34 and other long-time-constant thermal effects.

In accordance with the preferred embodiment of the present invention, an on-chip portion of linearizer 12 implemented in predistortion processor 20 is programmed with two translation functions selected from the family of translation functions 52 (FIG. 2). PA thermal modeler 50 is configured to generate interpolation signal 26 in response to temperature signals 24 and/or 38 and configured so that the on-chip portion of linearizer 12 in predistortion processor 20 interpolates between or extrapolates beyond the two translation functions 52 programmed therein to generate predistortion signals appropriate for the current operating conditions.

Figure 3:
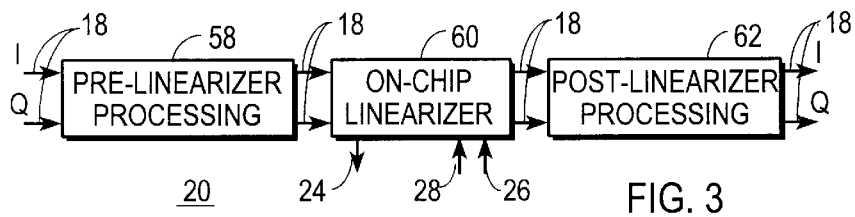
FIG. 3 shows a block diagram of a predistortion processor portion of the transmitter depicted in FIG. 1.

FIG. 3 shows a block diagram of predistortion processor 20. In the preferred embodiment, predistortion processor 20 is an integrated circuit in which all components thereof are implemented on a common semiconductor substrate. FIG. 3 indicates that predistortion processor 20 may include circuits not specifically related to linearization. For example, a pre-linearization processing section 58 may include one or more of an input formatting section and an interpolator. Those skilled in the art will appreciate that an interpolator in this context is a filtering circuit that may be used to increase sampling rate and is different from interpolating sections discussed below that perform mathematical interpolation operations and need not employ filtering.

After processing in pre-linearizer processing section 58, data-conveying signal 18 is routed to an on-chip linearizer 60. On-chip linearizer 60 is the on-chip portion of linearizer 12 (FIG. 1) that operates in conjunction with controller 22. Controller 22 is located off-chip, or external to on-chip linearizer 60. After predistortion in on-chip linearizer 60, data-conveying signal 18 passes to a post-linearizer processing section 62. Post-linearizer processing section 62 may include one or more of an IF conversion section, a correction filter, a gain/phase/offset correction section, and an output formatting section.

Figure 4:
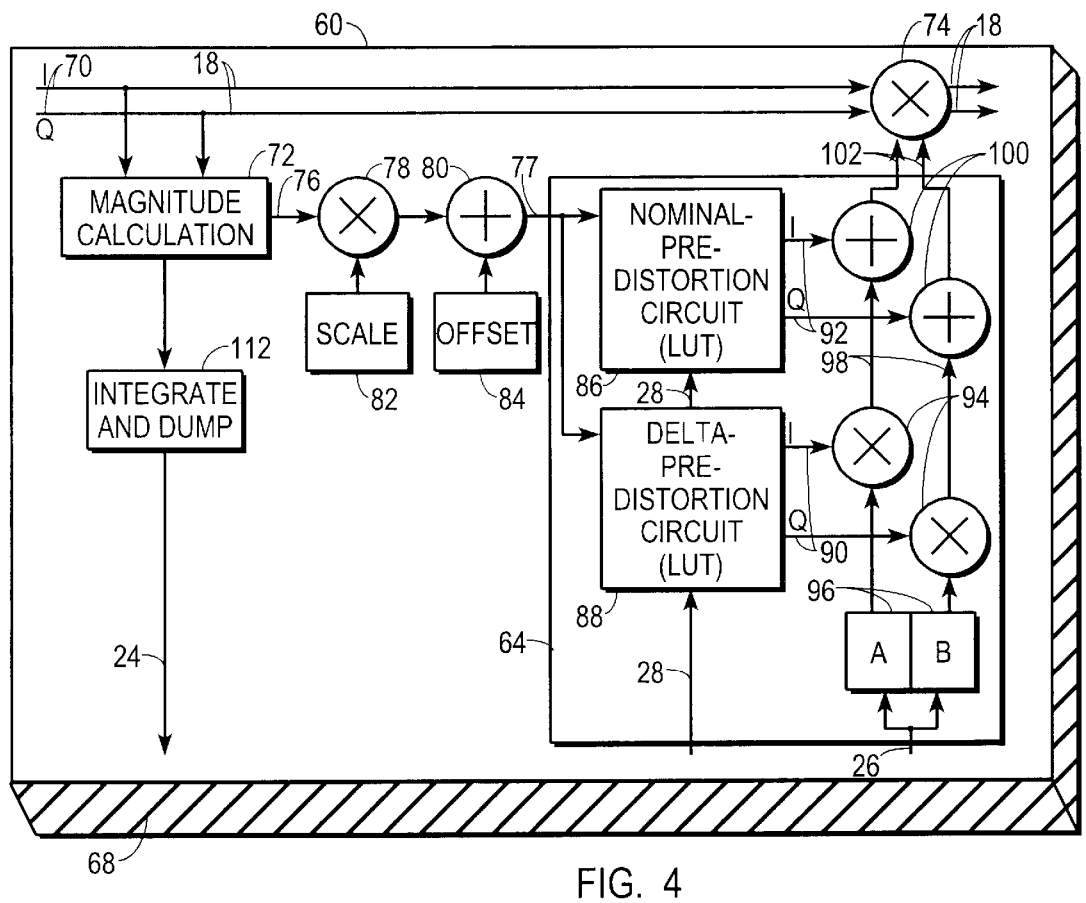
FIG. 4 shows a block diagram of an on-chip linearizer portion of the predistortion processor depicted in FIG. 2, where the on-chip linearizer is depicted as having a perturbation-interpolating section.
Figure 5:
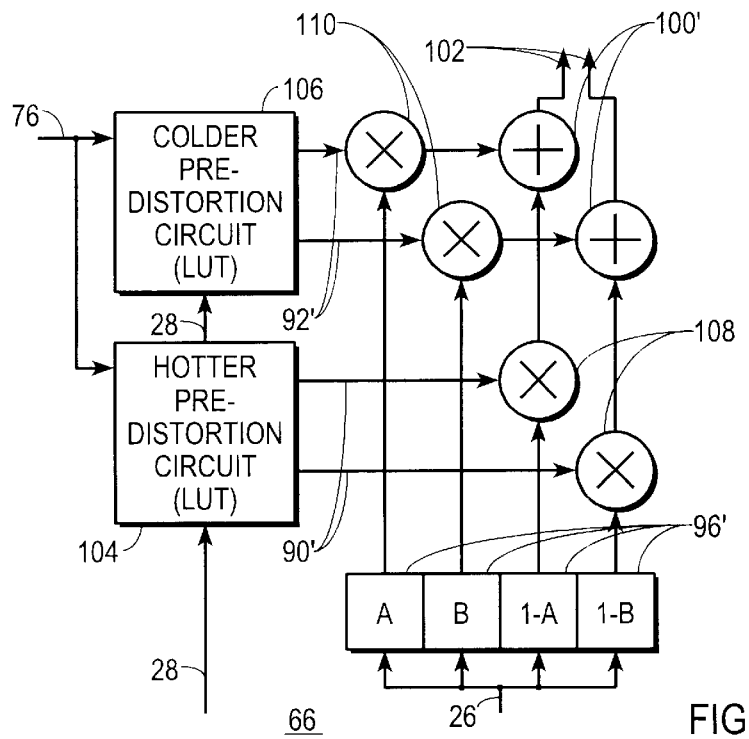
FIG. 5 shows a block diagram of a full-interpolating section that serves as an alternative embodiment to the perturbation-interpolating section depicted in FIG. 3.

FIG. 4 shows a block diagram of on-chip linearizer 60 from predistortion processor 20, where on-chip linearizer 60 is depicted as having a perturbation-interpolating section 64. A full-interpolating section 66 that may be substituted for perturbation-interpolating section 64 in an alternate embodiment is depicted in FIG. 5.

Referring to FIG. 4, all circuits of on-chip linearizer 60 are implemented on a common semiconductor substrate 68 using a semiconductor process such as CMOS compatible with the processing of high-speed data. Data-conveying signal 18 is applied as a complex signal having in-phase (I) and quadrature (Q) components at an input 70. Input 70 applies data-conveying signal 18 to inputs of a magnitude calculation section 72 and to first inputs of a complex multiplier 74. Magnitude calculation section 72 generates a magnitude signal 76 configured as a function of the magnitude of data-conveying signal 18. In the preferred embodiment, this magnitude function may be selected from among a linear power calculation, a $\log_2$ power calculation, and a linear voltage calculation. Magnitude signal 76 is routed through a multiplier 78, then an adder 80 before being applied to an input of perturbation-interpolating section 64 (FIG. 4) or full-interpolating section 66 (FIG. 5). In multiplier 78 and adder 80, magnitude signal 76 is multiplied by a first constant from a scale register 82 and offset by a second constant from an offset register 84, respectively. Registers 82 and 84 may be loaded with data from controller 22 (FIG. 1). Through sections 72, 78, 80, 82 and 84, magnitude is converted into an address signal 77.

Perturbation-interpolating section 64 includes a nominal-predistortion circuit 86 and a delta-predistortion circuit 88. Each predistortion circuit 86 and 88 is programmed by controller 22 (FIG. 1) to implement a different translation function 52. In the preferred embodiment, predistortion circuits 86 and 88 are each implemented as look-up tables (LUTs), and address signal 77 provides addresses to the look-up tables. Multiplier 78 and adder 80 may be included to adjust addressing for the look-up tables as may be appropriate to achieve the maximum resolution from the look-up tables. Those skilled in the art will appreciate that other address calculation techniques can be applied, such as those based on vectorized indirect addressing.

In the preferred embodiments, nominal-predistortion circuit 86 applies a translation function 56 (FIG. 2) associated with a first temperature for power amplifier 34 (FIG. 1), and delta-predistortion circuit 88 applies a translation function 54 associated with a second temperature for power amplifier 34. The figures depict nominal-predistortion circuit 86 as being associated with a colder temperature than delta-predistortion circuit 88, but this is not a requirement. Nominal-predistortion circuit 86 implements a translation function 56 that linearizes power amplifier 34 at the first temperature. In other words, if power amplifier 34 were to operate at the temperature corresponding to translation function 56 programmed into nominal-predistortion circuit 86, then the output from circuit 86 would describe the amount by which to distort data-conveying signal 18 so that nearly linear processing would effectively result after amplification in power amplifier 34.

However, nothing requires power amplifier 34 to operate precisely at the temperature corresponding to translation function 56. Preferably, translation function 56 programmed into nominal-predistortion circuit 86 is associated with the ambient temperature or with a temperature slightly cooler than the ambient. Self-heating in power amplifier 34 will then cause power amplifier 34 to experience a temperature somewhat hotter than translation function 56 programmed into nominal-predistortion circuit 86, but translation function 56 will nevertheless be near actual operating conditions should the ambient temperature drop.

Conversely, translation function 54 programmed into delta-predistortion circuit 88 is desirably associated with a temperature sufficiently greater than ambient to accommodate worst case self-heating in power-amplifier 34 at an ambient temperature somewhat higher than the current ambient. Under normal operating conditions, power amplifier 34 will rarely operate at the actual temperatures that correspond to translation functions 54 and 56 respectively programmed into delta- and nominal-predistortion circuits 88 and 86. Thus, perturbation-interpolating section 64 interpolates between the two curves represented by translation functions 54 and 56 to achieve a value that is appropriate for the actual current temperature experienced by power amplifier 34. Interpolation is performed in accordance with interpolation signal 26 provided by controller 22.

In order to maximize effectiveness of the resolution available from a given amount of memory used to implement predistortion circuits 86 and 88 and to reduce the semiconductor die area required to implement interpolating section 64, delta-predistortion circuit 88 is preferably programmed with offset values from corresponding points on translation function 56 programmed in nominal-predistortion circuit 86 rather than the absolute values of translation function 54. In other words, for each given input magnitude value, delta-predistortion circuit 88 is programmed with the complex difference between hotter translation function 54 and colder translation function 56 rather than the absolute values of hotter translation function 54. Thus, delta-predistortion circuit 88 generates a perturbation-predistortion signal 90 while nominal-predistortion circuit 86 generates a nominal-predistortion signal 92. Moreover, perturbation-predistortion signal 90 indicates an amount by which to adjust nominal-predistortion signal 92 to linearize power amplifier 34 when operating at the temperature associated with hotter translation function 54.

Perturbation-predistortion signal 90 is applied to first inputs of multipliers 94, where second inputs of multipliers 94 are fed by outputs from "A" and "B" registers 96. A and B registers 96 are repetitively loaded with data values provided in interpolation signal 26 from controller 22 at a rate that tracks self-heating in power amplifier 34. For linear interpolation, which is adequate for many applications, the A and B values are equal, e.g., A=B. However, in some applications better curve-fitting performance may be obtained by making the A value unequal to the B value, e.g., $A=B^2$. Thus, multipliers 94 scale perturbation-predistortion signal 90 in response to interpolation signal 26, or otherwise combine perturbation-predistortion signal 90 with interpolation signal 26, to generate a scaled-perturbation-predistortion signal 98.

Scaled-perturbation-predistortion signal 98 is then applied to adders 100 for combination with nominal-predistortion signal 92. Adders 100 produce a temperature-compensated predistortion signal 102 that represents an interpolation between the hotter and colder translation functions 54 and 56 programmed into predistortion circuits 88 and 86. Temperature-compensated predistortion signal 102 is output from interpolating section 64 and input to second inputs of complex multiplier 74. Complex multiplier 74 scales data-conveying signal 18 in the manner indicated by temperature-compensated predistortion signal 102. After amplification in power amplifier 34, data-conveying signal 18 will appear to have received nearly linear processing, regardless of thermal memory effects.

Referring to FIG. 5, full-interpolating section 66 differs from perturbation-interpolating section 64 (FIG. 4) in that absolute values for both hotter and colder translation functions 54 and 56 are implemented in hotter and colder predistortion circuits 104 and 106, respectively. Predistortion signals 90' and 92' respectively generated by hotter predistortion circuit 104 and colder predistortion circuit 106 are routed to multipliers 108 and 110. Multipliers 108 and 110 are fed by registers 96' which supply interpolation scale factors obtained in interpolation signal 26 from controller 22. Desirably, "A" and "1-A" registers 96' contain values that, when summed together, total one; "B" and "1-B" registers 96' contain values that, when summed together, total one. Outputs from multipliers 108 and 110 are combined in adders 100', and adders 100' produce temperature-compensated predistortion signal 102, which is routed to complex multiplier 74 (FIG. 4).

Referring back to FIG. 4, magnitude calculation section 72 provides an output to an integrate and dump section 112. Integrate and dump section 112 serves as another temperature indicator that generates temperature signal 24. The temperatures experienced by power amplifier 34 correspond to the power level at which power amplifier 34 is operating due to self-heating in power amplifier 34. The power level at which power amplifier 34 operates is responsive to the input power level, as defined by data-conveying signal 18 after processing in magnitude calculation section 72. Thus, temperature signal 24 correlates with the temperatures experienced by power amplifier 34, and is generated in response to data-conveying signal 18. Integrate and dump section 112 is configured to integrate the power signal over a period of time, then output the result for use by controller 22. In the preferred embodiment, temperature signal 24 may be updated at a rate of a new sample around every microsecond, which is sufficiently rapid to track instantaneous temperatures experienced by power amplifier 34 as a result of self-heating.

Figure 6:
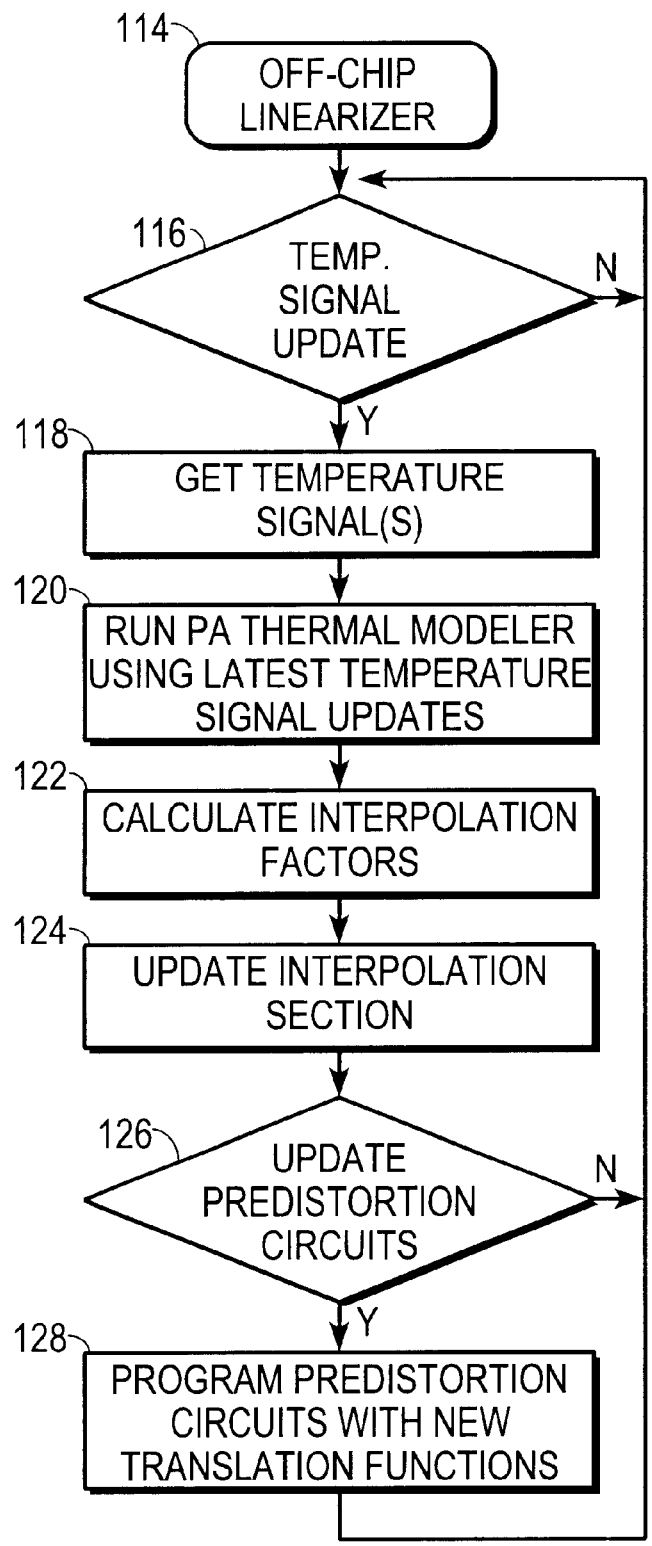
FIG. 6 shows a flow chart of an off-chip linearizer process performed by a controller for the transmitter depicted in FIG. 1.

FIG. 6 shows a flow chart of an exemplary off-chip linearizer process 114 performed by controller 22 (FIG. 1). In one embodiment process 114 is desirably performed in a manner defined by computer software executed in controller 22 and configured in a manner well-understood by those skilled in the art. In this embodiment, process 114 operates as a continuous loop that repetitively monitors temperature signals 24 and/or 38 and repetitively updates interpolation signal 26. In addition, process 114 may optionally continuously monitor the down-converted form of the amplified data-conveying signal 18 from down-conversion section 42 (FIG. 1) and repetitively operate trainer 48 and translation function generator 46 (FIG. 1) to track extremely-long-time-constant memory effects.

Process 114 includes a query task 116 that determines whether an update of a temperature signal 24 and/or 38 is available. So long as no update is available, program control may remain at task 116. When an update is discovered, a task 118 gets the subject temperature signal updates. As discussed above, temperature signals 24 and 38 provide data correlated to the temperatures experienced by power amplifier 34. Thus, following task 118, a task 120 runs power amplifier (PA) thermal modeler 50 (FIG. 1) by applying the updated temperature values to the filter implemented therein. As a result of running PA thermal modeler 50 in task 120, a new interpolator signal output 26 factor is generated in a task 122. This new interpolation signal 26 output factor provides a prediction of the identity of the translation function 52 (FIG. 2) that will better correspond to the current temperature experienced by power amplifier 34. That translation function 52 identity is expressed as a value that defines the amount of interpolation to apply between hotter and colder translation functions 54 and 56 programmed in predistortion circuits 88, 86 (FIG. 4) or 104, 106 (FIG. 5) within on-chip linearizer 60 (FIG. 4). Following task 122, a task 124 outputs the interpolation factors calculated in task 122 to interpolating section 64 (FIG. 4) or 66 (FIG. 5), where it will be used in performing future interpolations until subsequently updated again.

In another embodiment, temperature signals 24 and/or 38 may provide updates rapidly enough to make program-control-based updating impractical. Thus, fast temperature updates of temperature signals 24 and/or 38 can be processed in a special purpose hardware PA thermal modeler 50 portion of controller 22 (FIG. 1) that can update interpolator signal 26 at rates similar to the sampling rate of temperature signals 24/38. In this situation, one or more of tasks 116, 118, 120, 122, and 124 can be carried out in such a special purpose hardware PA thermal modeler 50 as needed to accommodate needed updating rates.

After task 124, or totally independent of one or more of tasks 116, 118, 120, 122, and 124 when one or more of these tasks are preformed in special purpose hardware, a query task 126 determines whether to update predistortion circuits 86 and 88 (FIG. 4) or 104 and 106 (FIG. 5) within on-chip linearizer 60 (FIG. 4). Predistortion circuits 86 and 88, or 104 and 106 are updated from time-to-time to track changes in ambient temperature for power amplifier 34 along with other physical changes in power amplifier 34 that result in extremely-long-time-constant memory effects, such as component aging. Most iterations of task 126 result in no update to predistortion circuits 86 and 88, or 104 and 106, and program control loops back to task 116. Consequently, predistortion circuits 86 and 88, or 104 and 106 are updated less frequently than interpolation signal 26. Desirably, predistortion circuits 86 and 88, or 104 and 106 are updated at a sufficiently slow rate that time is provided to complete any complex, time-consuming calculations performed in trainer 48 and translation function generator 46. Task 126 may base its decision upon temperature signal 38 and inputs from down-conversion section 42, upon a regular updating schedule, an ambient-monitoring temperature signal (not shown), or the like.

In the infrequent iterations of task 126 where a decision is made to update predistortion circuits 86 and 88, or 104 and 106, a task 128 is preformed. Task 128 programs predistortion circuits 86 and 88, or 104 and 106 with new translation functions 54' and 56' (FIG. 2). Accordingly, the hotter and colder translation functions programmed in on-chip linearizer 60 may change to track ambient temperature and other extremely-long-time-constant memory effects. This allows the hotter and colder translation functions to be associated with temperatures that are not too far apart, and reduces the interpolation range of interpolating sections 64 or 66. A reduced interpolation range leads to reduced error in the generation of temperature-compensated predistortion signal 102 (FIG. 4). However, translation functions need not be updated at that faster rate that would be needed to track self-heating in power amplifier 34. Consequently, task 128 may use a serial communication link to convey programming data 28 or share a communication link with interpolation signal 26 to convey updating translation functions that populate predistortion circuits 86 and 88, or 104 and 106.

In summary, the present invention provides an improved power amplifier linearizer and method that compensate for thermal memory effects. The power amplifier linearizer and method track power amplifier transfer function changes having long time constants without requiring an undesirably large number of look-up tables. In addition, the power amplifier linearizer and method are suitable for use in connection with high-speed data, where unit intervals tend to be less than a few microseconds. Further, the power amplifier linearizer and method use internal, on-chip predistortion translation functions augmented by an external thermal modeler.

Although the preferred embodiments of the invention have been illustrated and described in detail, it will be readily apparent to those skilled in the art that various modifications may be made therein without departing from the spirit of the invention or from the scope of the appended claims. For example, those skilled in the art will appreciate that on-chip linearizer 60 may be adapted to perform extrapolation in addition to or instead of interpolation. Additional conventional linearizing techniques may be used with the present invention. For example, power amplifier circuit design and/or conventional multiple LUT techniques may be used with the present invention to address short time-constant memory effects. Likewise, the memories and registers included in on-chip linearizer 60 may be configured in a double-buffered manner to promote hot-swapping techniques for updating programming. While the embodiment discussed above implements thermal modeler 50 off-chip, those skilled in the art will appreciate that thermal modeler may also be integrated with predistortion processor 20 on-chip. Furthermore, while the above discussion is directed primarily at thermal memory effects, nothing prevents the teaching of the present invention from additionally or alternatively being applied to correct other long time constant memory effects.

What is claimed is:

1. A method for linearizing a power amplifier comprising:
    a) generating a first predistortion signal in response to a data-conveying signal, said first predistortion signal being associated with a first temperature for said power amplifier;
    b) generating a second predistortion signal in response to said data-conveying signal, said second predistortion signal being associated with a second temperature for said power amplifier;
    c) obtaining a temperature signal which correlates with temperatures experienced by said power amplifier;
    d) producing a temperature-compensated predistortion signal in response to said first predistortion signal, said second predistortion signal, and said temperature signal; and
    e) scaling said data-conveying signal in response to said temperature-compensated predistortion signal.

2. A method as claimed in claim 1 wherein said producing activity comprises interpolating between said first and second predistortion signals in response to said temperature signal to produce said temperature-compensated predistortion signal.

3. A method as claimed in claim 1 wherein:
    said generating activities a) and b) generate said first and second predistortion signals by performing table look-up operations using first and second look-up tables, respectively; and
    said method additionally comprises updating said first and second look-up tables to track changes in ambient temperature for said power amplifier.

4. A method as claimed in claim 1 wherein:
    said generating activity a) applies a first translation function to said data-conveying signal and said generating activity b) applies a second translation function to said data-conveying signal; and
    said first and second translation functions change over time to track ambient temperature.

5. A method as claimed in claim 4 wherein:
    said temperature signal changes over time to track self-heating of said power amplifier; and
    said temperature signal is updated more frequently than said first and second translation functions.

6. A method as claimed in claim 1 additionally comprising modeling performance of said power amplifier in response to said temperature signal.

7. A method as claimed in claim 6 wherein:
    said modeling activity produces an interpolation signal; and
    said producing activity d) produces said temperature-compensated predistortion signal in response to said interpolation signal.

8. A method as claimed in claim 1 wherein said obtaining activity c) comprises generating said temperature signal in response to said data-conveying signal.

9. A method as claimed in claim 1 wherein said obtaining activity c) comprises generating said temperature signal in said power amplifier.

10. A method as claimed in claim 1 wherein:
    said generating activity a) is configured so that said first predistortion signal is a nominal-predistortion signal configured to linearize said power amplifier at a first temperature; and
    said generating activity b) is configured so that said second predistortion signal is a perturbation-predistortion signal which indicates an amount by which to adjust said nominal-predistortion signal to linearize said power amplifier at a second temperature.

11. A method as claimed in claim 10 wherein said producing activity d) comprises:
    producing an interpolation signal;
    scaling said perturbation-predistortion signal in response to said interpolation signal to produce a scaled-perturbation-predistortion signal; and
    combining said scaled-perturbation-predistortion signal with said nominal-predistortion signal to produce said temperature-compensated predistortion signal.

12. A power amplifier linearizer comprising:
    a first predistortion circuit configured to generate a first predistortion signal in response to a data-conveying signal, said first predistortion signal being associated with a first temperature for said power amplifier;
    a second predistortion circuit configured to generate a second predistortion signal in response to said data-conveying signal, said second predistortion signal being associated with a second temperature for said power amplifier;

a temperature indicator for generating a temperature signal which correlates with temperatures experienced by said power amplifier;

a combiner coupled to said first predistortion circuit, said second predistortion circuit, and said temperature indicator, said combiner being configured to produce a temperature-compensated predistortion signal in response to said first predistortion signal, said second predistortion signal, and said temperature signal; and a scaling circuit coupled to said combiner and adapted to receive said data-conveying signal, said scaling circuit being configured to scale said data-conveying signal in response to said temperature-compensated predistortion signal.

13. A power amplifier linearizer as claimed in claim 12 wherein said combiner is configured to interpolate between said first and second predistortion signals in response to said temperature signal.

14. A power amplifier linearizer as claimed in claim 12 wherein:

said first predistortion circuit comprises a first look-up table;

said second predistortion circuit comprises a second look-up table; and said power amplifier linearizer additionally comprises a controller coupled to said first look-up table and said second look-up table, said controller being configured to update said first and second look-up tables to track changes in ambient temperature for said power amplifier.

15. A power amplifier linearizer as claimed in claim 12 wherein:

said first predistortion circuit applies a first translation function to said data-conveying signal;

said second predistortion circuit applies a second translation function to said data-conveying signal;

said first and second predistortion circuits are programmable; and said first and second translation functions change over time to track ambient temperature.

16. A power amplifier linearizer as claimed in claim 15 wherein:

said temperature indicator is configured so that said temperature signal changes over time to track self-heating of said power amplifier; and said temperature indicator is configured so that said temperature signal is updated more frequently than said first and second translation functions.

17. A power amplifier linearizer as claimed in claim 12 additionally comprising a modeler coupled to said temperature indicator and said combiner, said modeler being configured to model thermal performance of said power amplifier in response to said temperature signal.

18. A power amplifier linearizer as claimed in claim 17 wherein:

said modeler produces an interpolation signal; and said combiner produces said temperature-compensated predistortion signal in response to said interpolation signal.

19. A power amplifier linearizer as claimed in claim 17 wherein:

said first and second predistortion circuits, said combiner, and said scaling circuit share a common semiconductor substrate; and said modeler is implemented externally to said common semiconductor substrate.

20. A power amplifier linearizer as claimed in claim 12 wherein said temperature indicator is configured so that said temperature signal is generated in response to said data-conveying signal.

21. A power amplifier linearizer as claimed in claim 12 wherein said temperature indicator is configured so that said temperature signal is generated in response to a signal generated in said power amplifier.

22. A power amplifier linearizer as claimed in claim 12 wherein:

said first predistortion circuit is configured so that said first predistortion signal is a nominal-predistortion signal configured to linearize said power amplifier at a first temperature; and said second predistortion circuit is configured so that said second predistortion signal is a perturbation-predistortion signal which indicates an amount by which to adjust said nominal-predistortion signal to linearize said power amplifier at a second temperature.

23. A power amplifier linearizer as claimed in claim 22 wherein:

said power amplifier linearizer additionally comprises a modeler coupled to said temperature indicator and said combiner and configured to generate an interpolation signal;

said combiner is configured to scale said perturbation-predistortion signal in response to said interpolation signal to produce a scaled-perturbation-predistortion signal; and said combiner is further configured to combine said scaled-perturbation-predistortion signal with said nominal-predistortion signal to produce said temperature-compensated predistortion signal.

24. A power amplifier linearizer as claimed in claim 12 wherein:

said first predistortion circuit comprises a first look-up table; and said second predistortion circuit comprises a second look-up table.

25. In a digital communication system, a power amplifier linearizer which compensates for thermal memory effects of a transmitter power amplifier and comprises:

a look-up table having an input responsive to a data-conveying signal, said look-up table producing a nominal-predistortion signal;

a temperature indicator for generating a temperature signal which correlates with temperatures experienced by said power amplifier;

a perturbation circuit having an input responsive to said temperature signal and configured to generate a scaled-perturbation-predistortion signal which indicates an amount by which to adjust said nominal-predistortion signal;

a combiner coupled to said perturbation circuit and to said look-up table for adjusting said nominal-predistortion signal by said scaled-perturbation-predistortion signal to produce a temperature-compensated predistortion signal; and a scaling circuit coupled to said combiner and adapted to receive said data-conveying signal, said scaling circuit being configured to scale said data-conveying signal in response to said temperature-compensated predistortion signal.

26. A power amplifier linearizer as claimed in claim 25 wherein said look-up table is a first look-up table, said nominal-predistortion signal is configured to linearize said power amplifier at a first temperature, said combiner is a first combiner, and said perturbation circuit comprises:

a second look-up table having an input responsive to said data-conveying signal and being configured to generate a perturbation-predistortion signal which indicates an amount by which to adjust said nominal-predistortion signal to linearize said power amplifier at a second temperature; and a second combiner responsive to said temperature signal and said perturbation-predistortion signal, said second combiner being configured to produce said scaled-perturbation-predistortion signal.

27. A power amplifier linearizer as claimed in claim 26 wherein said power amplifier linearizer additionally comprises a controller coupled to said first look-up table and said second look-up table, said controller being configured to update said first and second look-up tables to track changes in ambient temperature for said power amplifier.

28. A power amplifier linearizer as claimed in claim 25 additionally comprising a modeler coupled to said temperature indicator and said perturbation circuit, said modeler being configured to model thermal performance of said power amplifier in response to said temperature signal.

29. A power amplifier linearizer as claimed in claim 28 wherein:

said modeler produces an interpolation signal; and said perturbation circuit produces said scaled-perturbation-predistortion signal in response to said interpolation signal.

* * * * *